United States Patent
Wang et al.

(10) Patent No.: US 6,776,861 B2
(45) Date of Patent: Aug. 17, 2004

(54) TAPE COMPOSITION AND PROCESS FOR INTERNALLY CONSTRAINED SINTERING OF LOW TEMPERATURE CO-FIRED CERAMIC

(75) Inventors: Carl Baasun Wang, Raleigh, NC (US); Kenneth Warren Hang, Hillsborough, NC (US); Christopher Roderick Stewart Needes, Chapel Hill, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/336,439

(22) Filed: Jan. 2, 2003

(65) Prior Publication Data

US 2003/0234072 A1 Dec. 25, 2003

Related U.S. Application Data

(60) Provisional application No. 60/385,697, filed on Jun. 4, 2002.

(51) Int. Cl.[7] ............................................. B32B 31/04
(52) U.S. Cl. .................................. 156/89.11; 156/89.12
(58) Field of Search ........................... 156/89.11, 89.12, 156/89.16; 428/209, 210, 901

(56) References Cited

U.S. PATENT DOCUMENTS

| | | | |
|---|---|---|---|
| 5,085,720 A | | 2/1992 | Mikeska et al. |
| 5,102,720 A | * | 4/1992 | Raj ............................ 428/209 |
| 5,144,526 A | | 9/1992 | Vu et al. |
| 5,708,570 A | * | 1/1998 | Polinski, Sr. ............... 361/762 |
| 5,858,145 A | * | 1/1999 | Sreeram et al. .......... 156/89.16 |
| 5,866,240 A | * | 2/1999 | Prabhu et al. ............. 428/210 |
| 6,139,666 A | | 10/2000 | Fasano et al. |
| 6,205,032 B1 | | 3/2001 | Shepherd |
| 6,228,196 B1 | * | 5/2001 | Sakamoto et al. ........ 156/89.17 |
| 6,258,191 B1 | * | 7/2001 | Fasano et al. ......... 1569/89.12 |
| 6,337,123 B1 | * | 1/2002 | Ryugo et al. ............... 428/210 |
| 6,432,239 B1 | * | 8/2002 | Mandai et al. ........... 156/89.12 |
| 6,582,541 B2 | * | 6/2003 | Nishide et al. ........... 156/89.12 |
| 2002/0189742 A1 | * | 12/2002 | Moriya et al. ........... 156/89.11 |

FOREIGN PATENT DOCUMENTS

| | | | |
|---|---|---|---|
| WO | 00/04577 | * | 1/2000 |

* cited by examiner

*Primary Examiner*—Melvin C. Mayes

(57) ABSTRACT

The present invention relates to a method to achieve the suppression of planar shrinkage in LTCC ceramic tape laminate structures without externally applied forces or sacrificial constraining tape. The method utilizes a non-sacrificial constraining tape that constrains a tape assembly.

3 Claims, 11 Drawing Sheets

TAPE COMPOSITION AND PROCESS FOR INTERNALLY CONSTRAINED SINTERING OF LOW TEMPERATURE CO-FIRED CERAMIC

FIELD OF THE INVENTION

The invention relates to a tape composition and the use of the tape in a method for substantially reducing or controlling planar shrinkage and reducing distortion of ceramic bodies during firing.

BACKGROUND OF THE INVENTION

An interconnect circuit board is a physical realization of electronic circuits or subsystems made from a number of extremely small circuit elements that are electrically and mechanically interconnected. It is frequently desirable to combine these diverse type electronic components in an arrangement so that they can be physically isolated and mounted adjacent to one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways, called vias, through a dielectric layer. Such a multilayer structure allows a circuit to be more compact.

The use of a ceramic green tape to make low temperature co-fired ceramic (LTCC) multilayer circuits was disclosed in U.S. Pat. No. 4,654,095 to Steinberg. The co-fired, free sintering process offered many advantages over previous technologies. However, shrinkage during the firing process was difficult to control when larger circuits were needed. A trend toward finer via diameters, pitch and lines and spaces continues to push the limit of free sintering LTCC technology.

An improved co-fired LTCC process was developed and is disclosed in U.S. Pat. No. 5,085,720 to Mikeska. The process placed a ceramic-based release tape layer on the external surfaces of a green LTCC laminate assembly. The tape controlled shrinkage during the firing process. The process is a great improvement regarding the reproducibility of shrinkage during firing. It allowed the fired dimension of circuit features to be predictable.

U.S. Pat. No. 6,139,666 to Fasano et al. discloses a process where the edges of a multilayer ceramic are chamfered with a specific angle to correct edge distortion, due to imperfect shrinkage control exerted by an externally applied release tape during firing.

Another process for control of registration in an LTCC structure was disclosed in U.S. Pat. No. 6,205,032 to Shepherd. The process fires a core portion of a LTCC circuit incurring normal shrinkage and shrinkage variation of an unconstrained circuit. Subsequent layers are made to match the features of the pre-fired core, which then is used to constrain the sintering of the green layers laminated to the rigid pre-fired core. The planar shrinkage is controlled to the extent of 0.8–1.2%. The technique is limited to a few layers, before registration becomes unacceptable.

As disclosed in U.S. Pat. No. 5,085,720 during the firing step to form a refractory ceramic article, a constraining tape layer or layers on the surface of the article acts to pin and restrain possible shrinkage of the article in the x and y directions due to the refractory and rigid properties of the constraining tape. The un-sintered material in the constraining tape is then removed by brushing or other cleaning procedure. The constrained material may be composed of one or more layers of green tape, which sinter and densify to form a desired ceramic LTCC body.

In the production of LTCC circuits, the use of a sacrificial constraining tape means that the user must purchase a tape material that does not end up in the final product and that it also causes a cleanliness issue (un-sintered powder removal from fired part surface) in the furnace area. Furthermore, the top and bottom surface circuitry may not be patterned and co-fired between the LTCC body and the constraining tape. In the present invention, the constraining tape is fundamentally different. It is found layered on or within the LTCC structure and becomes part of the final LTCC body.

SUMMARY OF THE INVENTION

The invention is directed to a method for reducing x,y shrinkage during firing of a green assembly comprising at least one layer of glass-containing non-sacrificial constraining tape and at least one layer of glass-containing primary tape wherein the constraining tape and the primary tape are laminated to form an assembly, wherein the tape layers of the assembly upon thermal processing exhibit an interactive suppression of x,y shrinkage.

DETAILED DESCRIPTION OF THE INVENTION

The current invention extends the teachings of constrained sintering to the use of a non-fugitive, non-removable or non-release constraining tape that is inserted in or on an assembly that comprises predominantly a layer or layers of a primary tape that defines the properties required of the LTCC assembly, so that zero or almost zero shrinkage occurs in the x,y direction after the assembly is fired (i.e., shrinkage is enhanced in the z-direction). In addition, the production of blind or through cavities in or on an assembly by conventional methods has been an ongoing problem. The current invention solves such problems because the layers can conform to such cavities.

Figure 1:
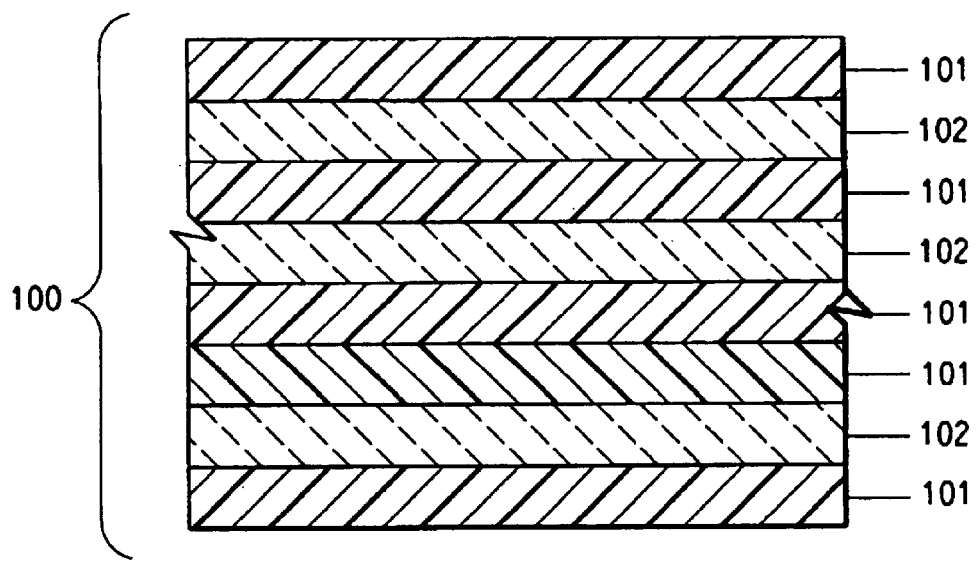
FIG. 1 is an illustration of an assembly formed by the method of the present invention.

In one embodiment of this invention as shown in FIG. 1, a physical constraining layer (102) is formulated to be a functional component of the LTCC final assembly (100). The properties of the constraining layer are to provide a rigid physical form to restrain the x and y shrinkage of the primary tapes (101); however, its purpose is extended to impart functional properties to the final LTCC assembly. There is no sacrificial or material lost to the constraining process. The constraining tape of this invention, in general, precedes the sintering of the primary tape layers. Although the constraining tape may be placed between layers of the primary tape, it is not essential to be in the exact center of a the assembly prior to firing, so long as a structural symmetry between the primary and constraining tape exists. Preferably, the number of primary to constraining tape layers is in the range of 10 to 1. Also, preferably, the overall thickness of the primary to the constraining tape layer is in the range of 30:1 to 12:5. This symmetry should be around a horizontal plane that bisects the z-axis at the center point.

This limitation is currently dictated by the choice of materials in the primary tape. The constraining tape may also be placed on the outer surface of primary tape materials. The constraining tape is further characterized as composed of a filler ceramic material such as $Al_2O_3$, $ZrO_2$, $ZrSiO_4$, etc., with a crystallizable or filler reactable glass composition so that its flow, densification and rigidification during firing proceed the remaining layers of primary tape. Although a constraining or primary tape normally may consist of a glass and filler, it may be designed by skilled artisans to utilize more than one glass or more than one filler. The physical act of restricting the x,y shrinkage of the constraining tape by the primary tape during thermal processing is quite similar to the externally applied constraining layers of a conventional primary tape assembly. It is to be noted, however, that although the terms of "primary tape" and "constraining tape" are used in this invention, the "primary tape" constrains the "constraining tape" during its lower temperature sintering/crystallization process; whereas the already sintered "constraining tape" constrains the "primary tape" during its higher temperature firing. The requirements for suitable materials to serve as a non-sacrificed constraining tape are however different. These material requirements are considered below.

A conventional LTCC primary tape typically processes at temperatures near 850° C. When a conventional release constraining tape is used, it must not sinter or become part of the final LTCC body to function properly. Contrary to that, a constraining tape of the present invention contains glasses that flow, densify, and become rigid at temperatures significantly below 850° C., which is a standard process temperature.

The constraining tape becomes part of the final LTCC body. This significantly increases the performance requirements for the constraining tape material. The electrical properties (i.e., dielectric constant) of the constraining tape may also be adjusted with a choice of materials that make up the tape. This makes possible the use of more than one chemical type of primary tape to locally control the dielectric and other electrical properties of a portion of a LTCC circuit.

The primary tape is generally the majority tape in a LTCC assembly and the resultant fired assembly derives its mechanical and electrical characteristics from it. In most situations the constraining tape has a minority presence in the structure. It can be used effectively to locally modify aspects of the dielectric and other electrical performance of the assembly, but its biggest influence is to control the physical structure by constraining its x,y shrinkage substantially to zero.

One embodiment involves two layers of primary tape located on opposing sides of a single layer of constraining tape. During the heating of the assembly, the glass in the constraining tape attains its transition temperature (the temperature at which the glass softens and flows) earlier than the glass of the primary tape and it flows sufficiently to coat the surface particles of the adjacent layers of the primary tape. Since the crystallization temperature of this glass is close to its transition temperature, crystallization occurs very soon after. This has the result of stiffening the glass and significantly raising its composite viscosity or elevating its re-melting temperature beyond the peak firing temperature of 825 to 875° C. of the first co-firing and/or subsequent post-firing process.

Although crystallization is a preferred method to rigidify tape after the densification and flow period of a glass filled tape, phase immiscibility using glass or glass-filler mixtures to effectively rigidify the tape is also a possible method. This process from sintering onset to rigidification can be measured for glass and filler combinations by the use of TMA, Thermo-mechanical analysis. For example, preferably the glass in the primary tape exhibits an onset of dimensional change as measured in TMA of about 700° C. or higher. Preferably the glass in the constraining tape exhibits an onset of dimensional change as measured in TMA of about 75° C. or more preferably 100 to 150° C. lower than the primary tape.

The constraining influence of the primary tape ensures that x,y shrinkage in the constraining tape is very small, if not zero. Subsequent increases in temperature cause the constraining tape to sinter fully and its glass to complete its crystallization. Since a suitable glass will, typically, develop in excess of 50 volume % crystalline phases, the constraining tape body becomes rigid when dominated by the volumetric accumulation of crystalline content of filler and in situ formation of crystal from the glass. Then, when the transition temperature of the primary tape glass is achieved and flow occurs, it is kept physically in place by its previous interaction with the constraining tape. Thus, the already-sintered constraining tape layers becomes the constraining force and the primary tape is constrained while sintering to shrink only in the z-direction. Once the assembly is fully sintered and has cooled down, the assembly will be seen to possess the same dimensions in the x,y direction as the original "green" or unfired assembly. The layers of the now chemically-reacted inorganic components of the two or more individual tapes used in the assembly are interleaved in various configurations. The only still observable boundaries being those where tapes of different chemistries were placed adjacent to each other.

Such an innovation offers the advantages of facilitating cofireable top and bottom conductors and also relieves the practical restrictions that externally-constrained sintered structures experience as the layer count is increased and the constraining influence of the external release tape is felt less and less. Furthermore, there is no need to remove the sacrificial constraining tape by mechanical and/or chemical means, hence the saving of equipment expenditure, labor, and the possible environmental contamination. In addition, the use of the constraining tape allows the formation of exactly dimensioned, non-shrink cavities in a tape structure. Both blind and through cavities can be produced by this constrained sintering technique.

In order to meet the performance requirements of LTCC circuit manufacturers, additional material performance factors must be considered beyond the simple process of constraining the x,y shrinkage in the green tape assembly when thermally processed. The coefficient of thermal expansion of both the constraining tape and the primary tape must be sufficiently close in magnitude to provide for the production of 6"×6" or larger ceramic boards consisting of many layers of laminated green tape materials. In attention to this could result in stress induced cracking in the fired ceramic LTCC body during the temperature descending portion of the furnace firing or thereafter.

Another design factor is created because the constraining tape dielectric must be thermally processed to a rigid body prior to the primary tape to provide proper system x,y constraint. This means that the glass-filler material in the constraining tape should be designed to attain a lower composite viscosity to the primary tape, but at a temperature of approximately 50–150° C. lower in temperature and preferably in the range of 80–150° C. It should be noted that the above assessment was based on a belt furnace firing profile at an ascending rate of 6–8° C. per minute between 450° C. and 800° C. Such a profile is commonly used to achieve high throughput in mass production of LTCC circuit substrates. However, a smaller temperature difference (e.g. <50° C.) can also be effective if the firing profile in a multiple zone belt or box furnace provides a plateau to facilitate the full densification, and/or crystallization, and rigidification of the constraining tape. It should also provide sufficient compatibility between constraining and primary tapes during the densification to maintain the strength and bonding at the respective tape interfaces. This compatibility can be influenced by tape formulation, physical characteristics of the constituents and changes in thermal processing conditions. The electrical properties of the constraining tape material must also meet performance requirements for high frequency circuit applications. Tape components and formulations follow.

Specific examples of glasses that may be used in the primary or constraining tape are listed in Table 1. Preferred glass compositions found in the constraining tape comprise the following oxide constituents in the compositional range The glasses described herein are produced by conventional glass making techniques. The glasses were prepared in 500–1000 gram quantities. Typically, the ingredients are weighed then mixed in the desired proportions and heated in a bottom-loading furnace to form a melt in platinum alloy crucibles. As well known in the art, heating is conducted to a peak temperature (1450–1600° C.) and for a time such that the melt becomes entirely liquid and homogeneous. The glass melts were then quenched by counter rotating stainless steel roller to form a 10–20 mil thick platelet of glass. The resulting glass platelet was then milled to form a powder with its 50% volume distribution set between 1–5 microns. The glass powders were then formulated with filler and organic medium to cast tapes as detailed in the Examples section. The glass compositions shown in Table 1 represent a broad variety of glass chemistry (high amounts of glass former to low amounts of glass former). The glass former oxides are typically small size ions with high chemical coordination numbers such as $SiO_2$, $B_2O_3$, and $P_2O_5$. The remaining oxides represented in the table are considered glass modifiers and intermediates.

TABLE 1

(wt. %)

| Glass # | $SiO_2$ | $Al_2O_3$ | PbO | $ZrO_2$ | $B_2O_3$ | CaO | BaO | MgO | $Na_2O$ | $Li_2O$ | $P_2O_5$ | $TiO_2$ | $K_2O$ | $Cs_2O$ | $Nd_2O_3$ | SrO |
|---|---|---|---|---|---|---|---|---|---|---|---|---|---|---|---|---|
| 1 | | | | | 6.08 | | 23.12 | | | | 5.40 | 34.25 | | | 32.05 | |
| 2 | 13.77 | | | 4.70 | 26.10 | | 14.05 | 35.09 | | 1.95 | 4.34 | | | | | |
| 3 | 55.00 | 14.00 | | | 9.00 | 17.50 | | 4.50 | | | | | | | | |
| 4 | | | | | 11.91 | | 21.24 | | | 0.97 | 4.16 | 26.95 | | 4.59 | 30.16 | |
| 5 | 56.50 | 9.10 | 17.20 | | 4.50 | 8.00 | | 0.60 | 2.40 | | | | 1.70 | | | |
| 6 | | | | | 11.84 | | 21.12 | | | 1.31 | 4.14 | 25.44 | | 6.16 | 29.99 | |
| 7 | 52.00 | 14.00 | | | 8.50 | 17.50 | | 4.75 | 2.00 | 0.25 | | | 1.00 | | | |
| 8 | | | | | 6.27 | | 22.79 | | | 0.93 | 4.64 | 33.76 | | | 31.60 | |
| 9 | | | | | 9.55 | | 21.73 | | | 0.92 | 4.23 | 32.20 | | 1.24 | 30.13 | |
| 10 | | | | | 10.19 | | 21.19 | | | 0.97 | 4.15 | 28.83 | | 4.58 | 30.08 | |
| 11 | 13.67 | | | 5.03 | 25.92 | | 13.95 | 34.85 | | 1.94 | 4.64 | | | | | |
| 12 | 12.83 | | | 4.65 | 21.72 | | 13.09 | 34.09 | | 1.96 | 11.65 | | | | | |
| 13 | 13.80 | | | 4.99 | 25.86 | | 13.34 | 33.60 | | 2.09 | 4.35 | | | 1.87 | | |
| 14 | 52.00 | 14.00 | | | 9.00 | 17.50 | | 5.00 | 1.75 | 0.25 | | | 0.50 | | | |
| 15 | 53.5 | 13.00 | | | 8.50 | 17.00 | | 1.00 | 2.25 | 0.25 | | | 1.50 | | | 3.00 |
| 16 | 13.77 | | | 4.70 | 22.60 | | 14.05 | 35.09 | | 1.95 | 7.84 | | | | | |
| 17 | 54.00 | 12.86 | | | 8.41 | 16.82 | | 0.99 | 2.23 | 0.25 | | | 1.48 | | | 2.96 | of: $B_2O_3$ 6–13, BaO 20–22, $Li_2O$ 0.5–1.5, $P_2O_5$ 3.5–4.5, $TiO_2$ 25–33, $Cs_2O$ 1–6.5, $Nd_2O_3$ 29–32 in weight %. The more preferred composition of glass being: $B_2O_3$ 11.84, BaO 21.12, $Li_2O$ 1.31, $P_2O_5$ 4.14, $TiO_2$ 25.44, $Cs_2O$ 6.16, $Nd_2O_3$ 29.99 in weight %. Another preferred glass comprises the following oxide constituents in the compositional range of: $SiO_2$ 12–14, $ZrO_2$ 3–6, $B_2O_3$ 20–27, BaO 12–15, MgO 33–36, $Li_2O$ 1–3, $P_2O_5$ 3–8, $Cs_2O$ 0–2 in weight %. The preferred composition of glass being: $SiO_2$ 13.77, $ZrO_2$ 4.70, $B_2O_3$ 26.10, BaO 14.05, MgO 35.09, $Li_2O$ 1.95, $P_2O_5$ 4.34 in weight %.

Preferred glasses for use in the primary tape comprise the following oxide constituents in the compositional range of: $SiO_2$ 52–54, $Al_2O_3$ 12.5–14.5, $B_2O_3$ 8–9, CaO 16–18, MgO 0.5–5, $Na_2O$ 1.7–2.5, $Li_2O$ 0.2–0.3, SrO 0–4, $K_2O$ 1–2 in weight %. The more preferred composition of glass being: $SiO_2$ 53.50, $Al_2O_3$ 13.00, $B_2O_3$ 8.50, CaO 17.0, MgO 1.00 $Na_2O$ 2.25, $Li_2O$ 0.25, SrO 3.00, $K_2O$ 1.50 in weight %.

In the primary or constraining tape the $D_{50}$ (median particle size) of frit is preferably in the range of, but not limited to, 0.1 to 5.0 mils and more preferably 0.3 to 3.0 mils.

Ceramic filler such as $Al_2O_3$, $ZrO_2$, $TiO_2$, $BaTiO_3$ or mixtures thereof may be added to the castable dielectric composition in an amount of 0–50 wt. % based on solids. Depending on the type of filler, different crystalline phases are expected to form after firing. The filler can control dielectric constant and loss over the frequency range. For example, the addition of $BaTiO_3$ can increase the dielectric constant significantly.

$Al_2O_3$ is the preferred ceramic filler since it reacts with the glass to form an Al-containing crystalline phase. $Al_2O_3$ is very effective in providing high mechanical strength and inertness against detrimental chemical reactions. Another function of the ceramic filler is rheological control of the entire system during firing. The ceramic particles limit flow of the glass by acting as a physical barrier. They also inhibit sintering of the glass and thus facilitate better burnout of the organics. Other fillers, α-quartz, $CaZrO_3$, mullite, cordierite, forsterite, zircon, zirconia, $BaTiO_3$, $CaTiO_3$, $MgTiO_3$, $SiO_2$, amorphous silica or mixtures thereof may be used to modify tape performance and characteristics. It is preferred that the filler has at least a bimodal particle size distribution with D50 of the larger size filler in the range of 1.5 and 2 microns and the D50 of the smaller size filler in the range of 0.3 and 0.8 microns.

In the formulation of tape compositions, the amount of glass relative to the amount of ceramic material is important. A filler range of 20–40% by weight is considered desirable in that the sufficient densification is achieved. If the filler concentration exceeds 50% by wt., the fired structure is not sufficiently densified and is too porous. Within the desirable glass/filler ratio, it will be apparent that, during firing, the liquid glass phase will become saturated with filler material.

For the purpose of obtaining higher densification of the composition upon firing, it is important that the inorganic solids have small particle sizes. In particular, substantially all of the particles should not exceed 15 μm and preferably not exceed 10 μm. Subject to these maximum size limitations, it is preferred that at least 50% of the particles, both glass and ceramic filler, be greater than 1 μm and less than 6 μm.

The organic medium in which the glass and ceramic inorganic solids are dispersed is comprised of a polymeric binder which is dissolved in a volatile organic solvent and, optionally, other dissolved materials such as plasticizers, release agents, dispersing agents, stripping agents, antifoaming agents, stabilizing agents and wetting agents.

To obtain better binding efficiency, it is preferred to use at least 5% wt. polymer binder for 90% wt. solids, which includes glass and ceramic filler, based on total composition. However, it is more preferred to use no more than 30% wt. polymer binder and other low volatility modifiers such as plasticizer and a minimum of 70% inorganic solids. Within these limits, it is desirable to use the least possible amount of binder and other low volatility organic modifiers, in order to reduce the amount of organics which must be removed by pyrolysis, and to obtain better particle packing which facilitates full densification upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly (vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly (lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

U.S. Pat. No. 4,536,535 to Usala, issued Aug. 20, 1985, has disclosed an organic binder which is a mixture of compatible multipolymers of 0–100% wt. C18 alkyl methacrylate, 100–0% wt. $C_{18}$ alkyl acrylate and 0–5% wt. ethylenically unsaturated carboxylic acid of amine. Because the above polymers can be used in minimum quantity with a maximum quantity of dielectric solids, they are preferably selected to produce the dielectric compositions of this invention. For this reason, the disclosure of the above-referred Usala application is incorporated by reference herein.

Frequently, the polymeric binder will also contain a small amount, relative to the binder polymer, of a plasticizer that serves to lower the glass transition temperature (Tg) of the binder polymer. The choice of plasticizers, of course, is determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1,3-monoisobutyrate, toluene, methylene chloride and fluorocarbons. Individual solvents mentioned above may not completely dissolve the binder polymers. Yet, when blended with other solvent(s), they function satisfactorily. This is well within the skill of those in the art. A particularly preferred solvent is ethyl acetate since it avoids the use of environmentally hazardous chlorocarbons.

In addition to the solvent and polymer, a plasticizer is used to prevent tape cracking and provide wider latitude of as-coated tape handling ability such as blanking, printing, and lamination. A preferred plasticizer is BENZOFLEX® 400 manufactured by Rohm and Haas Co., which is a polypropylene glycol dibenzoate.

Application

A green tape for use as a constraining tape or a primary tape is formed by casting a thin layer of a slurry dispersion of the glass, ceramic filler, polymeric binder and solvent(s) as described above onto a flexible substrate, heating the cast layer to remove the volatile solvent. It is preferred that the primary tape not exceed 20 mils in thickness and preferably 1 to 10 mils. It is preferred that the constraining tape be 1 to 10 mils and preferably 1 to 3 mils in thickness. The tape is then blanked into sheets or collected in a roll form. The green tape is typically used as a dielectric or insulating material for multilayer electronic circuits. A sheet of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize and form via holes in the green tape. Typical via hole sizes range from 0.004" to 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric constant inks can be printed on selected layer(s) to form resistive or capacitive circuit elements. Furthermore, specially formulated high dielectric constant green tapes similar to those used in the multilayer capacitor industry can be incorporated as part of the multilayer circuitry.

After each layer of the circuit is completed, the individual layers are collated and laminated. A confined uniaxial or isostatic pressing die is used to insure precise alignment between layers. The laminate assemblies are trimmed with a hot stage cutter. Firing is carried out in a standard thick film conveyor belt furnace or in a box furnace with a programmed heating cycle. This method will, also, allow top and/or bottom conductors to be co-fired as part of the constrained sintered structure without the need for using a conventional release tape as the top and bottom layer, and the removal, and cleaning of the release tape after firing.

As used herein, the term "firing" means heating the assembly in an oxidizing atmosphere such as air to a temperature, and for a time sufficient to volatilize (burn-out) all of the organic material in the layers of the assemblage to sinter any glass, metal or dielectric material in the layers and thus densify the entire assembly.

It will be recognized by those skilled in the art that in each of the laminating steps the layers must be accurate in registration so that the vias are properly connected to the appropriate conductive path of the adjacent functional layer.

The term "functional layer" refers to the printed green tape, which has conductive, resistive or capacitive functionality. Thus, as indicated above, a typical green tape layer may have printed thereon one or more resistor circuits and/or capacitors as well as conductive circuits.

EXAMPLES

Tape compositions used in the examples were prepared by ball milling the fine inorganic powders and binders in a volatile solvent or mixtures thereof. To optimize the lamination, the ability to pattern circuits, the tape burnout properties and the fired microstructure development, the following volume % formulation of slip was found to provide advantages. The formulation of typical slip compositions is also shown in weight percentage, as a practical reference. The inorganic phase is assumed to have a specific density of 4.5 g/cc for glass and 4.0 g/cc for alumina and the organic vehicle is assumed to have a specific density of 1.1 g/cc. The weight % composition changes accordingly when using glass and oxides other than alumina as the specific density maybe different than those assumed in this example.

|  | Volume % | Weight % |
|---|---|---|
| Inorganic phase | 41.9 | 73.8 |
| Organic phase | 58.1 | 26.2 |

The above volume and weight % slip composition may vary dependent on the desirable quantity of the organic solvent and/or solvent blend to obtain an effective slip milling and coating performance. More specifically, the composition for the slip must include sufficient solvent to lower the viscosity to less than 10,000 centipoise; typical viscosity ranges are 1,000 to 4,000 centipoise. An example of a slip composition is provided in Table 2. Depending on the chosen slip viscosity, higher viscosity slip prolongs the dispersion stability for a longer period of time (normally several weeks). A stable dispersion of tape constituents is usually preserved in the as-coated tape.

TABLE 2

| Slip Composition Component | Weight % |
|---|---|
| Acrylate and methacrylate polymers | 4.6 |
| Phthalate type plasticizers | 1.1 |
| Ethyl acetate/isopropyl alcohol mixed solvent | 20.4 |
| Glass powder | 50.7 |
| Alumina powder | 23.2 |

If needed, a preferred inorganic pigment at weight % of 0.5 to 1.0 may be added to the above slip composition before the milling process.

The glasses for the Examples found herein were all melted in Pt/Rh crucibles at 1450–1600° C. for about 1 hour in an electrically heated furnace. Glasses were quenched by metal roller as a preliminary step and then subjected to particle size reduction by milling. The powders prepared for these tests were adjusted to a 5–7 micron mean size by milling prior to formulation as a slip. Since additional milling is utilized in the fabrication of slip, the final mean size is normally in the range of 1–3 microns.

Thermo-mechanical analysis (TMA) measurements are presented in many of the following examples. The measurements were preformed using a TMA 2940 accessory module to a TA Instruments Thermal Analysis System. The samples were prepared by punching the green tape assembly to a 0.535" diameter with a thickness that varied with the specific sample. The samples were loaded with an actively controlled 5-gram load and heated at 10° C./min. to 850° C. A soak of 5 minute duration was used before completing the run. The data were corrected for offset from zero at 500° C. and plotted between 500° C. and 900° C.

Example 1

| Primary Tape Composition #1 (Glass #1, Table 1) (6.8 mils tape thickness) Glass: | |
|---|---|
| $B_2O_3$ | 6.08 wt. % |
| BaO | 23.12 |
| $P_2O_5$ | 4.5 |
| $TiO_2$ | 34.25 |
| $Nd_2O_3$ | 32.05 |
| Glass Density 4.72 g/cc Alumina Density 4.02 g/cc | |
| Filler: $Al_2O_3$ (D50 = 2.5 micron) | |
| Filler content 36.0 vol % | |
| Glass content: 64.0 vol % | |
| Constraining Tape Composition #1 (Glass #2, Table 1) Glass: | |
| $SiO_2$ | 13.77 wt. % |
| $ZrO_2$ | 4.7 |
| $B_2O_3$ | 26.1 |
| BaO | 14.05 |
| MgO | 35.09 |
| $Li_2O$ | 1.95 |
| $P_2O_5$ | 4.34 |
| Glass Density 3.06 g/cc Alumina Density 4.02 g/cc | |
| Filler: $Al_2O_3$ (D50 = 2.5 micron) | |
| Filler content 33.7 vol % | |

The solids formulation of the primary and constraining tapes are shown as filler and glass content above. Three tape structures were made using these materials in construction as follows:

| Test #1 | Prim#1/Constraining#1/Prim#1 constraining thickness 2.5 mils, total/constraining thickness ratio = 6.4 |
| --- | --- |
| Test #2 | Prim#1/2xConstraining#1/Prim#1 constraining thickness 5.0 mils, total/constraining thickness ratio = 3.7 |
| Test #3 | Prim#1/3xConstraining#1/Prim#1 constraining thickness 7.5 mils, total/constraining thickness ratio = 2.8 |

All samples were flat following belt furnace firing at 850° C., and they showed the following % x,y-shrinkage: Test #1 0.20%, Test #2 0.17%, and Test #3 0.05%.

Figure 2:
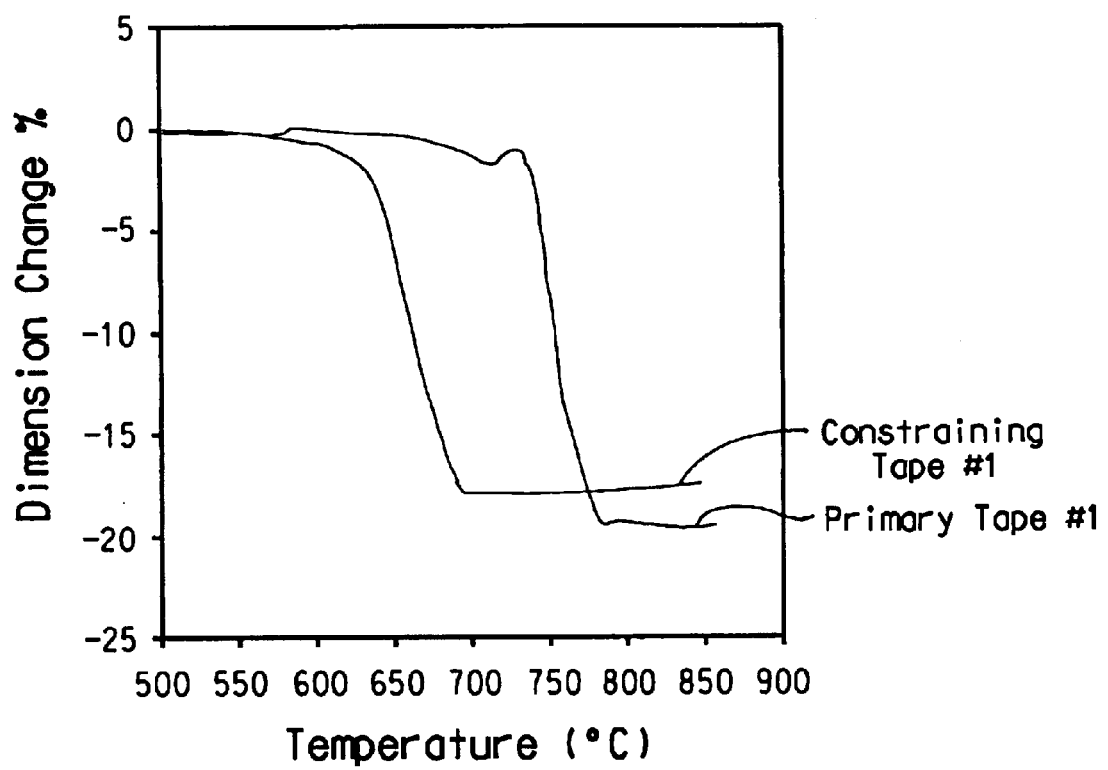
FIGS. 2–11 are Thermo-Mechanical Analysis Data (TMA) plots showing test results of the Examples.

The uniaxial thickness reduction or z-shrinkage of each tape is shown in the following Thermo-Mechanical Analysis Data (TMA) plot (FIG. 2) of the Primary #1 and Constraining #1 Tape materials. As can be seen from the plot, the onset of tape sintering is separated by about 75–85° C. The constraining tape can be seen to develop rigid property near 700° C. and the primary tape at this temperature is just beginning to sinter.

The influence of the constraining tape thickness is seen to relate in general to the x,y-shrinkage values.

Example 2

A Primary #2 Tape (5 mils thick) is paired with two different constraining tape compositions (Constraining #1 and Constraining #2) having identical total/constraining tape thickness ratio.

| Primary Tape Composition #2 (Glass #3, Table 1) Glass: Filler: $Al_2O_3$ (D50 = 2.5 micron) Filler content 36.0 vol % | |
| --- | --- |
| $SiO_2$ | 55.00 wt % |
| $Al_2O_3$ | 14.00 |
| $B_2O_3$ | 9.00 |
| CaO | 17.50 |
| MgO | 4.50 |
| Glass Density 2.52 g/cc Alumina Density 4.02 g/cc | |
| Constraining Tape Composition #2 (Glass #4, Table 1) Glass: Filler: $Al_2O_3$ (D50 = 2.5 micron) Filler content 33.7 vol % | |
| $B_2O_3$ | 11.91 wt. % |
| BaO | 21.24 |
| TiO2 | 26.95 |
| $Li_2O$ | 0.97 |
| $P_2O_5$ | 4.16 |
| $Cs_2O$ | 4.59 |
| $Nd_2O_3$ | 30.16 |
| Glass Density 4.54 g/cc Alumina Density 4.02 g/cc | |

The following tape structures are compared in this example:

| Test #4 | 2xPrim#2/Constraining#1/2xPrim#2 constraining thickness 2.5 mils, total/constraining thickness ratio = 9.0 |
| --- | --- |
| Test #5 | 2xPrim#2/3xConstraining#1/2xPrim#2 constraining thickness 7.5 mils, total/constraining thickness ratio = 3.7 |
| Test #6 | 2xPrim#2/Constraining#2/2xPrim#2 constraining thickness 2.5 mils, total/constraining thickness ratio = 9.0 |

All samples were flat following belt furnace firing at 850° C. and they showed the following % x,y-shrinkage: Test #4 0.19%, Test #5 0.03%, and Test #6 0.17%.

As one can see in Tests #4 and #5, the role of the thickness of the constraining tape influences the degree of x,y-shrinkage control. A significant point is shown in Tests #4 and #6, which have different constraining tape glass compositions and yet exhibit similar shrinkage control under identical tape laminate construction.

Figure 3:
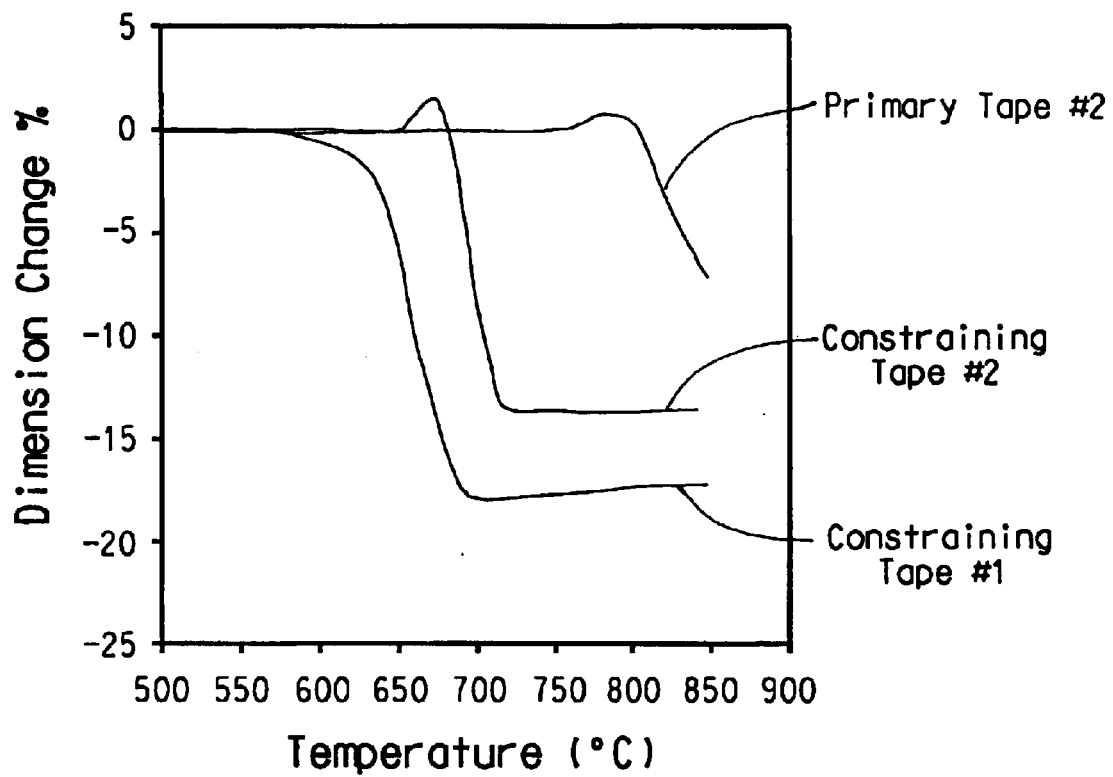

The TMA properties of the Primary #2, Constraining #1 and Constraining #2 Tapes are shown in the FIG. 3. As the plot of these three tapes illustrates, the Constraining Tape #2 has a somewhat higher temperature at which it attains rigidity than Constraining Tape #1. However since the Primary Tape #2 has a higher temperature for onset of sintering than the Primary #1 Tape, either constraining tape achieves good x,y-shrinkage control in composite structures. The Test #4 or #6 shows, respectively, a 125° C. or 150° C. separation in sintering onset. These data show that a more generalized trend is attained when specific characteristics of the paired tape materials are satisfied.

Example 3

This example uses the Constraining Tape #1 with another Primary Tape #3. Although it is most desirable for both primary and constraining tapes to exhibit at least partial crystallization during their respective firing as shown in Examples 1 and 2, it is not essential.

| Primary Tape #3 (Glass #5. Table 1) (Tape Thickness 4.5 mils) Glass: | |
| --- | --- |
| $SiO_2$ | 56.5 wt. % |
| $Al_2O_3$ | 9.1 |
| PbO | 17.2 |
| $B_2O_3$ | 4.5 |
| Primary Tape #3 (Glass #5. Table 1) (Tape Thickness 4.5 mils) Glass: | |
| CaO | 8 |
| MgO | 0.6 |
| $Na_2O$ | 2.4 |
| $K_2O$ | 1.7 |
| Glass Density 2.80 g/cc Alumina Density 4.02 g/cc Filler: $Al_2O_3$ (D50 = 2.5 micron) Filler content 36.0 vol % | |

Figure 4:
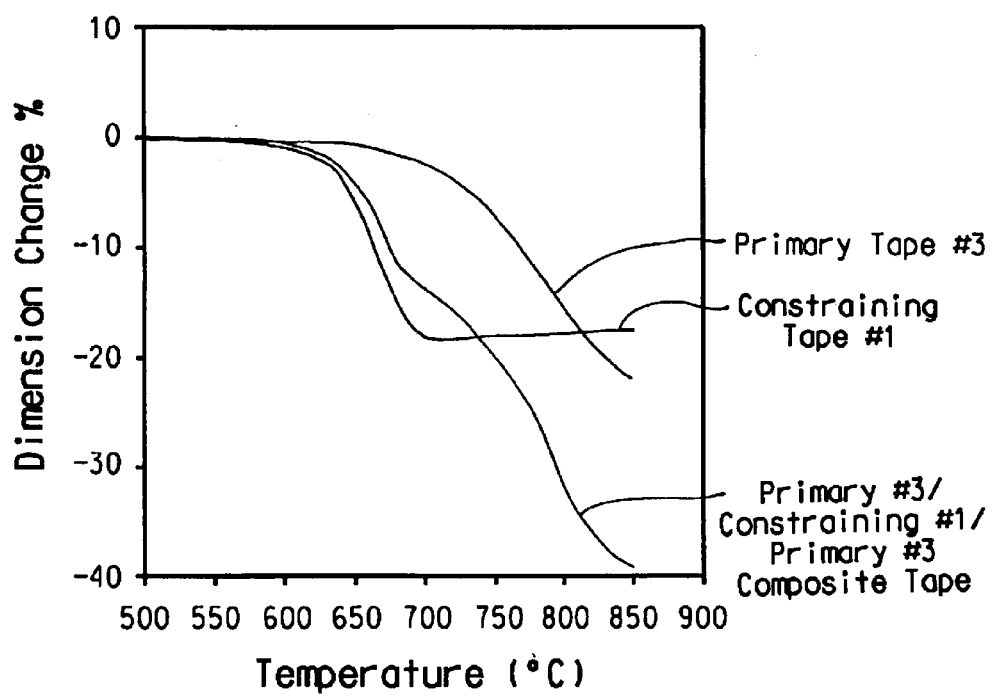
Figure 5:
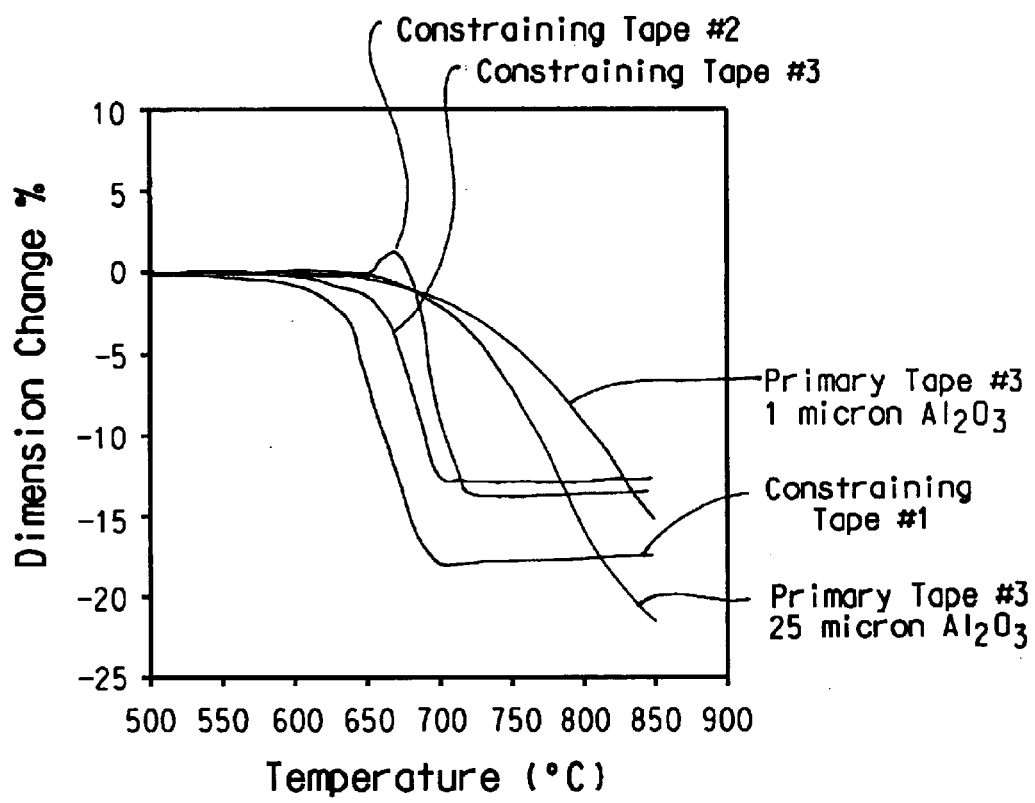

The TMA plots for 3 tape samples are shown in FIG. 4. The Constraining Tape #1 is plotted with Primary Tape #3 which has a lesser tendency to crystallize than the previous two examples. Additionally a sample made from composite tape layers of 2xPrim #3/Constraining #½x Prim #3 was measured. The x,y-shrinkage for this composite sample was measured to be 1.24% (constraining thickness 2.5 mils, total to constraining thickness ratio=8.2). The dimensional change % or the z-shrinkage is approximately twice as large in the TMA data for the composite tape (nearly 40%) as either the Primary Tape #3 (about 21 %) or the Constraining Tape #1 (about 18%). This is consistent with the fact that smaller x,y-shrinkage is associated with larger z-shrinkage for a similar level of volumetric shrinkage achieved by densification of a LTCC body. As one can see from the data and plot, the control of x,y-shrinkage is not as good as the previous examples. The x,y-shrinkage of the Primary #3 Tape is normally 12.7% and the shrinkage of the Constraining Tape #1 is 11.8%. Although the Primary Tape #3 does crystallize partially during its firing to 850° C., it does so more slowly and was therefore less effectively controlled by the Constraining Tape #1, inspite of what appears to be an adequate constraining tape as demonstrated when used in a tape composite using either Primary Tape #1 or #2. In an additional test, the 2.5-micron PSD (D50) Al2O3 filler was replaced with 1-micron (D50) $Al_2O_3$. The higher surface area typical of a smaller particle size would be expected to increase reaction speed between glass and filler. This, in turn, would be expected to increase the rate of partial crystallization in the tape and therefore result in improved control of x,y-shrinkage control in an identical composite tape structure. The plot in FIG. 5 shows TMA data for Primary Tape #3 made with 2.5 micron powder and in a second tape sample Primary Tape #3 with 1 micron powder. The data confirms that the 1 micron $Al_2O_3$ has increased the reaction rate with the glass decreasing the extent of dimension change between the onset of sintering and 850° C. when the heating program converted to a soak temperature at 850° C. and the run was terminated. This reduction in shrinkage is considered to be caused by the lower volumetric shrinkage of a more rapidly developing crystalline phase, that potentially impedes densification. The plot in FIG. 5 also shows TMA curves for the three Constraining Tapes #1, #2, #3. Constraining Tapes #1 and #3 are close to possessing the same physical behavior in the TMA. The onset of sintering in Constraining #1 precedes the Constraining #3 Tape. However, both tapes become rigid at essentially the same temperature.

Example 4

In another experiment, Primary Tape #3 has been used with 2.5 micron alumina to demonstrate the capacity to form a blind cavity in a tape laminate assembly. The following test structure was prepared: 3×Prim #3/4×Constraining #1/3× Prim #3(through cavity in the top half sub-assembly of 10 layers)/3×Prim #3/4×Constraining #1/3×Prim #3 (no cavity in the bottom half sub-assembly of 10 layers) x,y-shrinkage =1.05%, constraining thickness 20.0 mils, size 3"×3", total/constraining tape thickness ratio=3.7.

This test demonstrated the formation of a "blind" cavity in a 20 layer tape laminate assembly whereby the cavity depth is the same as the fired thickness of 10 layer sub-assembly (i.e., 6 primary tape and 4 constraining tape layers). The x,y-shrinkage of the above assembly is equal to an otherwise identically made assembly free of cavity structure. For those skillful in the art, both blind and open cavity structures can be formed so long as proper steps are taken to obtain adequate pressure distribution during lamination.

Example 5

| Constraining Tape #3 (Glass #6 Table 1 Glass: | |
|---|---|
| B2O3 | 11.84 wt. % |
| BaO | 21.12 |
| Li2O | 1.31 |
| P2O5 | 4.14 |
| TiO2 | 25.44 |
| Constraining Tape #3 (Glass #6 Table 1 | |
| Cs2O | 6.16 |
| Nd2O3 | 29.99 |
| Glass Density 4.45 g/cc Alumina Density 4.02 g/cc | |
| Filler: Al2O3 (D50 = 2.5 micron) | |
| Filler content 33.7 vol % | |

The following tape structures are compared in this example:

| | |
|---|---|
| Test #7 | 2xPrim#3-2.5/Constraining#1/2xPrim#3 constraining thickness 2.5 mils total/constraining ratio = 8.2 |
| Test #8 | 2xPrim#3-1/Constraining#1/2xPrim#3 constraining thickness 2.5 mils total/constraining ratio = 8.2 |
| Test #9 | 2xPrim#3/Constraining#2/2xPrim#3 constraining thickness 2.5 mils total/constraining ratio = 8.2 |
| Test #10 | 2xPrim#3/2xConstraining#3/2xPrim#3 constraining thickness 5.0 mils total/constraining ratio = 4.6 |

In these tests the following x,y-shrinkage values were measured:

| | |
|---|---|
| Test #7 | 1.24% (2.5 micron $Al_2O_3$ used) |
| Test #8 | 0.72% (1 mocron $Al_2O_3$ used) |
| Test #9 | 1.96% (2.5 micron $Al_2O_3$ used) |
| Test #10 | 0.98% (2.5 micron $Al_2O_3$ used, note double constraining thickness used). |

The use of the reduced particle size filler $Al_2O_3$ in Test #8 has reduced the x,y-shrinkage value of 1.24% by 42% to a value of 0.72%. This Test #8 has changed the maturing characteristics of the Primary Tape #3 to start the crystallization sooner than the Test #7 tape. The lower shrinkage of Test #8 is likely a trade off of full densification of the primary tape; therefore, the particle size of frit, filler, and frit chemistry are all important in the practical implementation of the invention. In the comparison of Test #7 and Test #9, Test #9 is seen to have less effective constraint of x,y-shrinkage, as the Constraining Tape #2 has a higher onset for sintering and becomes rigid 20–30° C. higher than Constraining Tape #1. The Constraining Tape #3 sample would have been expected to show x,y-shrinkage between 1.24% and 1.96%, if a single layer of constraining tape was used in the structure. Since two layers of Constraining Tape #3 were used, the shrinkage is reduced due to the additional constraining effect of the greater constraining tape thickness.

The constraining tape is not restricted to being sandwiched between primary tape layers. The following data illustrate the use of the constraining tape on the external surface to sandwich primary tape layers:

| | |
|---|---|
| Test #11 | Constraining #1/2xPrim#3/Constraining #1 x,y-shrinkage 1.29% constraining thickness 5.0 mils total/constraining ratio = 2.8 |
| Test #12 | Constraining #1/4xPrim#3/Constraining #1 x,y-shrinkage 1.08% constraining thickness 5.0 mils total/constraining ratio = 4.6 |
| Test #13 | Constraining #1/6xPrim#3/Constraining #1 x,y-shrinkage 1.02% constraining thickness 5.0 mils total/constraining ratio = 6.4 |
| Test #14 | Constraining #3/2xPrim#3/Constraining #3 x,y-shrinkage 0.96% constraining thickness 5.0 mils total/constraining ratio = 2.8 |

Although the Primary Tape #3 was not ideal for reducing the x,y-shrinkage to near zero, it illustrates the capacity to reduce and control the shrinkage with a suitable constraining tape composition whether applied external or internally in a tape assembly.

Example 6

Complex tape structures are given herein, the Primary Tape #3 can be seen to improve its x,y-shrinkage behavior by incorporating Primary Tape #1 in the laminate assembly as shown in the following examples: (Thickness Prim#1–6.8 micron, Thickness Prim#3–2.0 micron).

| | |
|---|---|
| Prim#3/Constraining#1/<br>Prim#3/2xPrim#1/<br>Prim#3/Constraining#1/Prim#3<br>Constraining thickness 5.0 mils<br>total/constraining ratio 5.3 | x,y-shrinkage 0.25% |
| Prim#3/Constraining#1/Prim#3/Prim#1/<br>Prim#3/Constraining#1/Prim#3<br>Constraining thickness 5.0 mils<br>total/constraining ratio 4.1 | x,y-shrinkage 0.28% |

| Primary Tape #1 composition (Glass #1, Table 1)<br>Glass: | |
|---|---|
| $B_2O_3$ | 6.08 wt. % |
| BaO | 23.12 |
| $P_2O_5$ | 4.5 |
| TiO2 | 34.25 |
| $Nd_2O_3$ | 32.05 |
| Glass Density 4.72 g/cc Alumina Density 4.02 g/cc | |
| Filler: $Al_2O_3$ (D50 = 2.5 micron) | |
| Filler content 36.0 vol % | |

Figure 6:
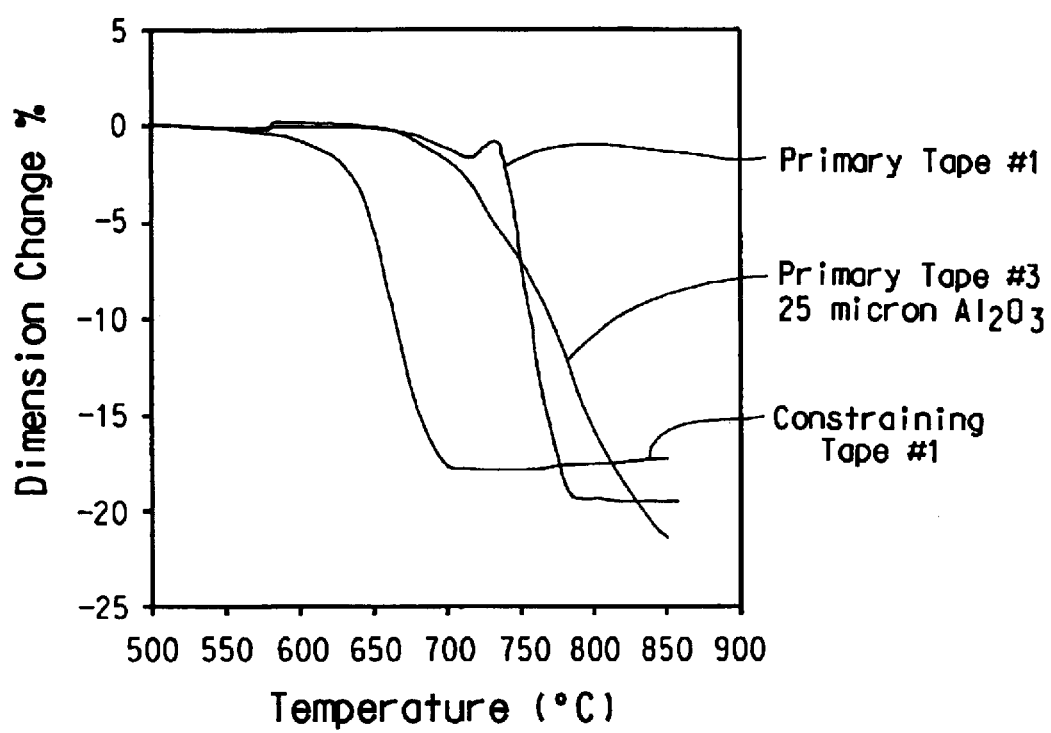

FIG. 6 shows the TMA properties for Primary Tape #1, Constraining Tape #1 and Primary Tape #3. The Primary Tape #1 is strongly crystallizable and clearly assists the stabilization of the x,y-shrinkage when present in the Primary #3 and Constraining #1 laminate structure.

Example 7

Figure 7:
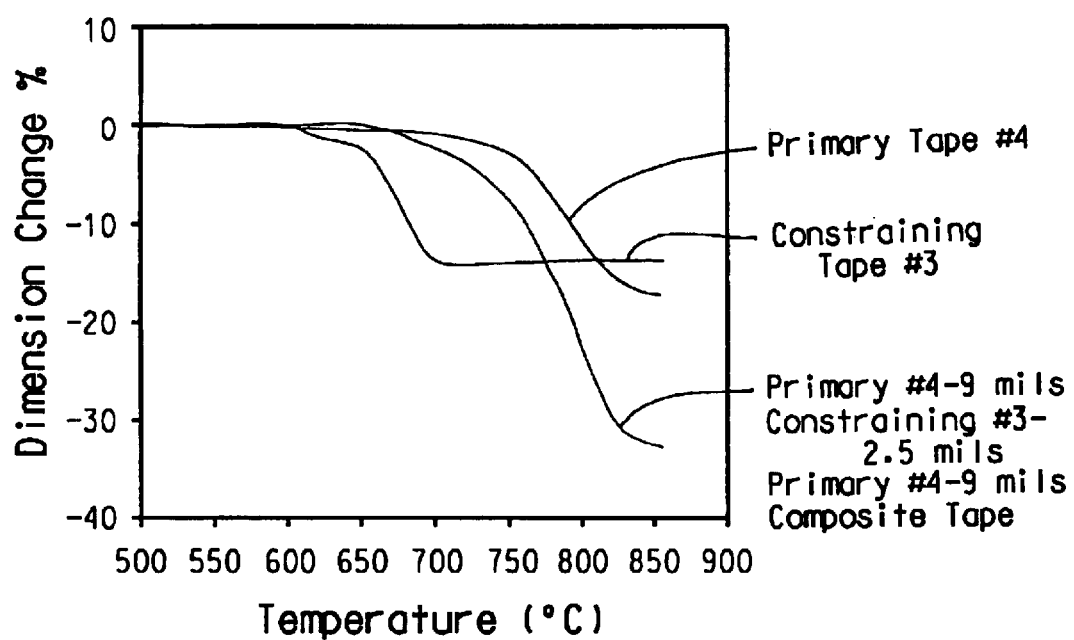

A modified version of the Glass #3, Table 1, used in Primary Tape #2 is shown as Primary Tape #4 (Glass #7, Table 1, Thickness 4.5 mils) in a TMA plot found in FIG. 7 with Constraining Tape #3, that was presented previously, and a composite tape with the following structure:

| | | |
|---|---|---|
| Test #15 | Prim #4x2/Constraining#3/Prim #4x2<br>Constraining thickness 2.5 mils<br>total/constraining thickness ratio = 8.2 | x,y-shrinkage 0.34% |

The Primary Tape #4 showed x,y shrinkage of 14.8% when fired by itself in air (not constrained). The TMA plot shows the z-axis shrinkage for the composite tape to be 32.5% while x,y-shrinkage was constrained to 0.34%.

| Primary Tape #4<br>Glass: | |
|---|---|
| $SiO_2$ | 52 wt. % |
| $Al_2O_3$ | 14 |
| $B_2O_3$ | 8.5 |
| CaO | 17.5 |
| MgO | 4.75 |
| $Na_2O$ | 2 |
| $Li_2O$ | 0.25 |
| $K_2O$ | 1 |
| Glass Density 2.56 g/cc Alumina Density 4.02 g/cc | |
| Filler: $Al_2O_3$ (D50 = 2.5 micron) | |
| Filler content 36.0 vol % | |

The composition is similar to the glass used in Primary Tape #2 with added alkali oxide materials to lower the viscosity of the glass. This is apparent in the earlier onset of sintering of the Primary #4 Tape versus the Primary #2 Tape. It is also apparent that some loss of the ability to limit x,y-shrinkage in the Primary #4/Constraining #3 versus Primary #2/Constraining #1 Tapes is realized. Since the Constraining #3 and Constraining #1 Tapes are essential rigidified at the same temperature, they are similar in behavior, while different in their chemistries.

Two basic glass chemistries (Constraining Tapes #1 and #3) as components in tape formulations have been shown to act effectively as x,y-shrinkage control in composite tape structures with both crystallizing glass and slow to crystallize glass serving as a component in the primary tape materials.

Example 8

The following example is intended to illustrate the dependency of x,y-shrinkage on the difference in tape sintering kinetics. Both of the Constraining Tape #4 (using Glass #8, Table 1, density—4.58 g/cc), and Constraining Tape #5 (using Glass # 10, Table 1, density—4.55 g/cc) were tested. All tapes were made in combination with 33.7 vol % alumina (2.5 micron D50) as described previously. Tape structures were prepared with Primary Tape #3 (that incorporates Glass #5 Table 1). The following test structures were made and their respective x,y-shrinkage values were measured.

| | | |
|---|---|---|
| Test #16 | 2xPrim #3/Constraining #4/2x Prim #3<br>constraining tape thickness 2.5 mils<br>total/constraining tape ratio = 8.2 | x,y-shrinkage = 3.98% |
| Test #17 | 2xPrim #3/Constraining #5/2x Prim #3<br>constraining tape thickness 2.5 mils<br>total/constraining tape ratio = 8.2 | x,y-shrinkage = 2.19% |

Figure 8:
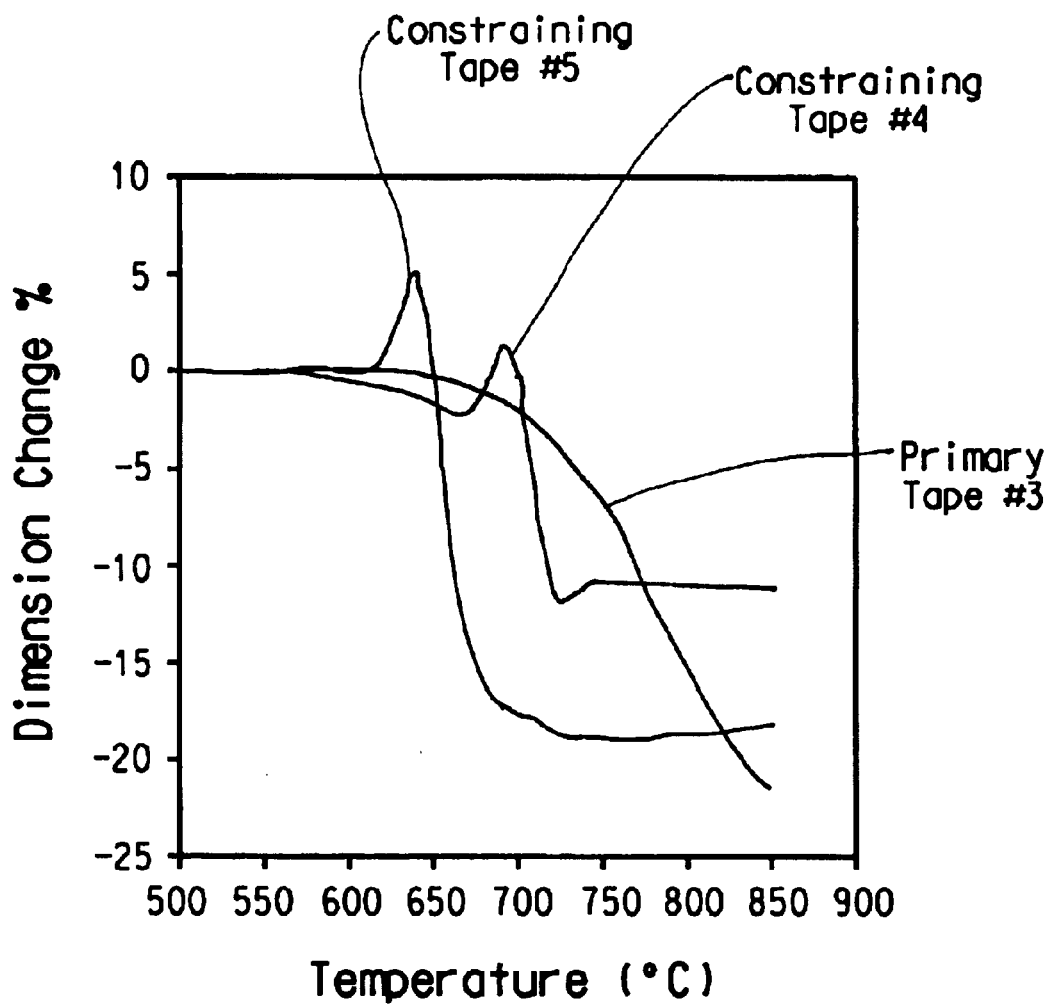

The TMA characteristic of each tape is shown in FIG. 8. The degree of x,y-shrinkage control can be seen to vary with the difference in the onset of sintering between the primary and constraining tapes. Hence the smaller shrinkage shown in Test 17 using Constraining Tape #5 starts sintering sooner than Constraining Tape #4 (Test 16). Both the Constraining Tapes #4 and #5 show an expansion anomaly near the onset of sintering of the respective tapes. This is not present in the Constraining Tapes #1 or #3 seen in previous figures. The presence of these expansion peaks in the sintering characteristics of Constraining Tapes #2, #4 and #5 is considered undesirable. The presence or absence of these peaks can be managed by ratio changes of constituents in the glass compositions. They may also be responsible for some unpredictable behavior due to the expansion preceding the shrinkage of the tape. However, they clearly illustrate the general behavior of several previous examples when used to constrain a primary tape. Based upon the differences in the onset and rigidification behavior of the tape pairs, the composite tape shrinkage in the x,y directions can be designed by glass and/or tape formulation to approach zero when thermally processed under standardized conditions (typically 850° C. for 15–20 minutes).

Example 9

In this example, another glass similar to Glass #3 and Glass #7 (Table 1) is used to formulate a designated Primary Tape #5 (Glass #14, Table 1, with 36.0 vol % alumina, 2.5 micron D50, Tape Thickness=4.5 mils). This tape is paired with a previously tested Constraining Tape #3 (Glass #6, Table 1). The following structures show an improved ability to approach zero x,y-shrinkage.

| Test #18 | 2xPrim #5/Constraining #1/2xPrim #5 constraining tape thickness 2.5 mils total/constraining tape ratio = 8.2 | x,y-shrinkage = 0.17% |
|---|---|---|
| Test #19 | 3xPrim #5/2xConstraining #1/3xPrim #5 constraining thickness 5.0 mils total/constraining tape ratio = 6.4 | x,y-shrinkage = 0.03% |
| Test #20 | 2xPrim #5/Constraining #3/2xPrim #5 constraining thickness 2.5 mils total/constraining tape ratio = 8.2 | x,y-shrinkage = 0.19% |
| Test #21 | 3xPrim #5/2xConstraining #3/3xPrim #5 constraining thickness 5.0 mils total/constraining tape ratio = 6.4 | x,y-shrinkage = 0.04% |

Figure 9:
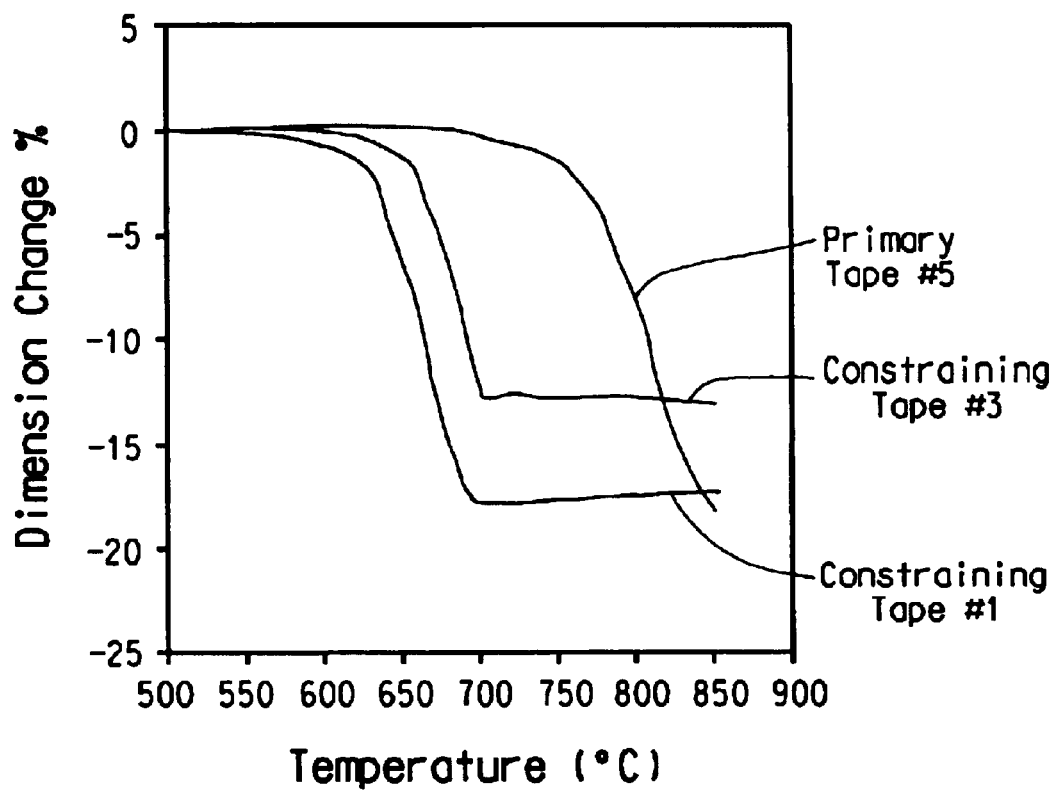

In Tests 18 and 19, the x,y-shrinkage constraint is again seen to be thickness ratio dependent. The structure in 19 with its more favorable (thicker Constraining #1 Tape) is seen to have near zero x,y-shrinkage. In Tests 20 and 21, the Constraining Tape chemistry is changed substantially, although the required onset temperature separation in TMA properties from the primary tape is essentially the same. This can be seen in FIG. 9. The Constraining Tape #1 is seen to have a slightly lower sintering onset than Constraining Tape #3, while the onset of rigidification during the firing is the same for both constraining tapes. The nearly identical x,y-shrinkage values in Test #18 and #20 or Test #19 and #21 appear to correlate with the same rigidification temperature of the Constraining Tape #1 and #3.

Example 10

In this example, a Primary Tape #6 (4.5 mils thick) which is composed of 33.9 vol % alumina (2.5 micron D50) with Glass #15, Table 1, is formulated as a tape. The tape was fired at 875° C. in a belt furnace to yield an average x,y-shrinkage of 13.87%. The following additional tests were performed on structures formed of Primary Tape #6 and Constraining Tape #3 (Glass #6, Table 1):

| Test #22 | 2xPrim #6/1xConstraining #3/2xPrim #6 constraining thickness 2.5 mils, size 3" × 3" total/constraining tape ratio = 8.2 | x,y-shrinkage = 0.00% |
|---|---|---|
| Test #23 | 3xPrim #6/2xConstraining #3/3xPrim #6 constraining thickness 5.0 mils, size 3" × 3" total/constraining tape ratio = 6.4 | x,y-shrinkage = -0.02% |
| Test #24 | 3xPrim #6/2xConstraining #3/3xPrim #6 constraining thickness 5.0 mils, size 5" × 5" total/constraining tape ratio = 6.4 | x,y-shrinkage = -0.13% |

Test 22 shows the attainment of zero x,y-shrinkage using a 2-1-2 layer structure. Test 23 with a 3-2-3 structure shows small negative shrinkage (expansion), which is essentially zero due to the measurement precision of ±0.00025 inch. Test #24 uses the same structure as Test #23, except it is a 5"×5" substrate size. This illustrates an ability to achieve dimensional control on small or larger size substrates. A second set of laminate structures was also fired at 850° C. in a belt furnace:

| Test #25 | 2xPrim #6/1xConstraining #3/2xPrim #6 constraining thickness 2.5 mils, size 3" × 3" total/constraining tape ratio = 8.2 | x,y-shrinkage = 0.03% |
|---|---|---|
| Test #26 | 3xPrim #6/1xConstraining #3/3xPrim #6 constraining thickness 2.5 mils, size 3" × 3" total/constraining tape ratio = 11.8 | x,y-shrinkage = -0.01% |
| Test #27 | 3xPrim #6/2xConstraining #3/3xPrim #6 constraining thickness 5.0 mils, size 3" × 3" total/constraining tape ratio = 6.4 | x,y-shrinkage = -0.03% |

Figure 10:
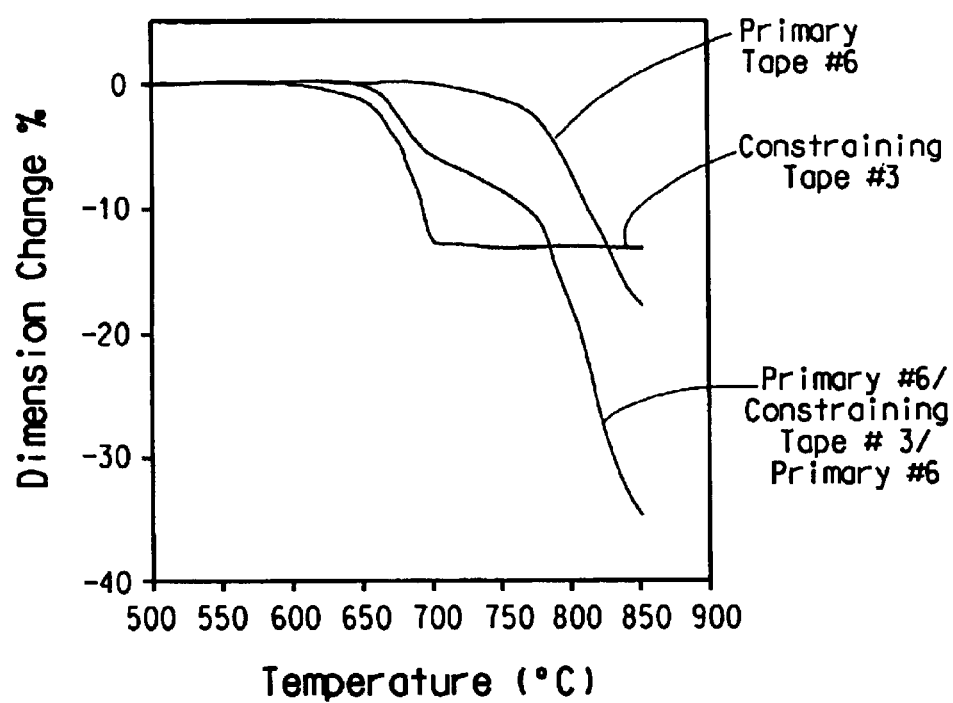

The results of test series #250–#27 (850° C. fired) and test series #22–#24 (875° C. fired) show excellent dimensional stability with change in peak firing temperature. The Primary Tape #6 by itself showed 13.87% shrinkage in x,y-directions after 875° C. firing. In the 3-1-3 laminate assembly with one layer of Constraining Tape #3 as in Test #26, the total to constraining tape thickness ratio is 11.8, and shows essentially zero x,y-shrinkage. This is an excellent example of the clear advantages of this invention. FIG. 10 shows TMA plots of Primary Tape #6, Constraining Tape #3, and a tape lamination of 2xPrim#6/Constraining #3/2x Prim#6. The x,y-shrinkage of the composite tape is essentially zero, whereas the z-shrinkage indicates 34%. This agrees with a calculation to convert the approximate volume change only to a uniaxial shrinkage in the z-direction. The temperature difference between the onset of tape shrinkage (near the respective glass transitions) between the two compositions of tape is 90–100C. However, the most significant occurrence is the fact that Constraining Tape #3 has become rigid before significant shrinkage has begun in the Primary #6 Tape, both occurring at 700° C.

If the primary tape is allowed to begin sintering before the x,y direction is constrained, then a non-zero level of x,y-shrinkage is the likely result. In order to achieve zero x,y-shrinkage, the tape formulations must be optimized for both primary and constraining tape. When the constraining tape starts sintering and completes its densification to become rigid, prior to the onset of sintering of the primary tape, the primary tape is acting to constrain the x,y-shrinkage of the constraining tape. As the primary tape begins to sinter, it is, in turn, constrained in x,y-directions by the rigid condition of the matured constraining tape.

The effect to minimize the fired x, y shrinkage as illustrated in Example 5 is discussed and demonstrated further here. Since the Primary Tape is acting to constrain the x, y shrinkage of the Constraining Tape at a temperature range between 600° C. (onset of Constraining Tape softening) and 700° C. (completion of Constraining Tape rigidification), the inorganic solid packing density in the Primary Tape plays a critical role. It is noted that most if not all of the organic substances (polymer binder, plasticizer, dispersion agent, and others) have been burn out before reaching 600° C. and the constraining effect of the Primary Tape has to come from its non-compressibility. This non-compressibility requires essentially no movement or transfer of inorganic solids in the Primary Tape under the stress generated by the Constraining Tape which undergoes frit softening, flow, sintering, and crystallization. The ability to control x, y shrinkage through the optimization of filler (i.e. alumina or other inorganic solids) particle sizes is demonstrated in the following Example 11.

Example 11

Primary Tape #6 with regular size alumina (D50=2.5 μm) and a modified Primary Tape #6 which maintains identical tape composition except substituting the above size alumina by a blend of medium (D50=1.8 μm) and fine (D50=0.5 μm) size alumina.

| Test #28 | 2xPrim #6/1xConstraining #3/2xPrim #6 constraining thickness 2.0 mils, total/constraining tape ratio = 10 | x,y-shrinkage = 0.11% |
|---|---|---|
| Test #29 | 2xmod.Prim #6/1xConstraining #3/ 2xmod. Prim #6 constraining thickness 2.0 mils, total/constraining tape ratio = 10 | x,y-shrinkage = 0.04% |
| Test #30 | 3xPrim #6/1xConstraining #3/3xPrim #6 constraining thickness 2.0 mils, total/constraining tape ratio = 14.5 | x,y-shrinkage = 0.15% |
| Test #31 | 3xmod. Prim #6/1xConstraining #3/ 3xmod. Prim #6 constraining thickness 2.0 mils, total/constraining tape ratio = 14.5 | x,y-shrinkage = 0.02% |
| Test #32 | 4xPrim #6/1xConstraining #3/4xPrim #6 constraining thickness 2.0 mils, total/constraining tape ratio = 19 | x,y-shrinkage = 0.13% |
| Test #33 | 3xmod. Prim #6/1xConstraining #3/ 3xmod. Prim #6 constraining thickness 2.0 mils, total/constraining tape ratio = 19 | x,y-shrinkage = 0.01% |

Figure 11:
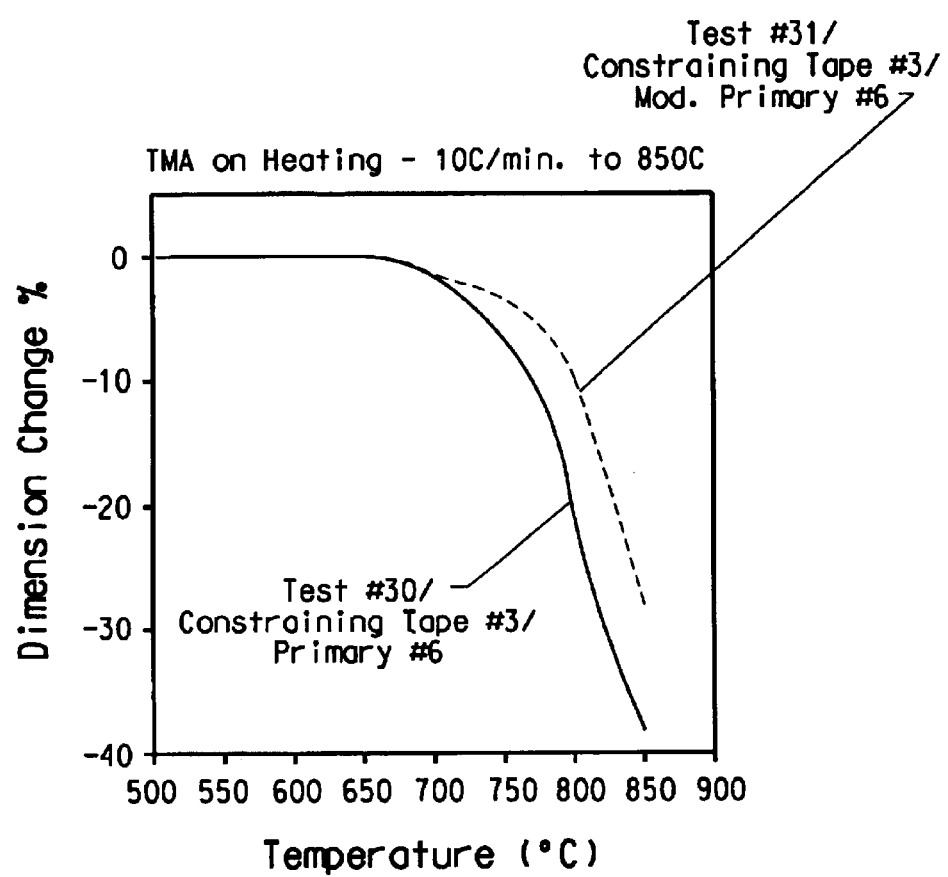

The TMA data for Test #30 and Test #31 are shown in FIG. 11. The z-shrinkage shown by the composite structure of Test #31 with modified Primary Tape #6/Constraining #3/modified Primary #6 with a blend of 1.8 micron and 0.5 micron alumina filler is about 28%. The regular 2.5 micron alumina filler containing Primary #6/Constraining #3/Primary #6 structure of Test #30 is about 38%. The less volumetric shrinkage of Test #31 was contributed by two factors. The first is the possible stimulation of more rapid crystallization in the modified Primary Tape #6 by the more reactive 0.5 micron alumina filler. The second is due to the increased filler packing density achieved by the blending of 1.8 and 0.5 micron filler.

To reconfirm the effect of inorganic particle size optimization, a Primary Tape #7 (Glass #17 in Table 1) was used in Example 12. The weight % composition of this tape is identical to that of the modified Primary Tape #6 except the choice of glass component in the tape.

Example 12

By exerting the interactive constraining effect of the Primary Tape (i.e. non-compressibility during the softening, flow, sintering, and crystallization of the Constraining Tape) and Constraining Tape (i.e. reaching the state of rigidification prior to softening of the Primary Tape) the following laminate assembly configurations provided nearly zero x, y shrinkage.

| Test #34 | 2xPrim #7/1xConstraining #3/2xPrim #7 constraining thickness 2.0 mils, total/constraining tape ratio = 10 | x,y-shrinkage = 0.01% |
|---|---|---|
| Test #35 | 3xPrim #7/1xConstraining #3/3xPrim#7 constraining thickness 2.0 mils, total/constraining tape ratio = 14.5 | x,y-shrinkage = 0.01% |
| Test #36 | 4xPrim #7/1xConstraining #3/4xPrim #7 constraining thickness 2.0 mils, total/constraining tape ratio = 19 | x,y-shrinkage = 0.04% |

The next section will deal with the asymmetrical tape laminate structure and its effect on property of the fired structure. The placement symmetry of the primary and constraining tape in a multi-layer tape assembly is the preferred mode because such structure leads to a balance in mechanical stress created by the difference in sintering and thermal coefficient of expansion between component tapes. All of the fired and flat LTCC substrates possess the above symmetry whereas substrate camber is noticeable with any asymmetrical build to-date. For all practical purposes, although a similar x,y-shrinkage control can be obtained, asymmetrical design must be converted to a symmetrical style by adding or subtracting primary or constraining tape layers to eliminate substrate camber. Tests #37 and #38 represent the results of tested asymmetrical configurations.

| Test #37 | Prim #3/Constraining #1/Prim#3/Prim#1/ Prim#3/Constraining #1/Prim#3/ Prim #3/Constraining #1/Prim#3 constraining thickness 2.5 mils total/constraining tape ratio = 4.3 | x,y-shrinkage = 0.26% 10 layer build camber > 20 mils/inch |
|---|---|---|
| Test #38 | Prim #3/Constraining #1/Prim#3/2xPrim#1/ Prim#3/ Constraining #1/Prim#3/ Prim #3/Constraining #1/Prim#3 constraining thickness 2.5 mils total/constraining tape ratio = 5.2 | x,y-shrinkage = 0.16% 11 layer build camber > 23 mils/inch |

This limitation to symmetrically built structures is applicable to the materials tested to-date and is not an indication of a fundamental problem. Correction of physical property differences between layer components of an LTCC build are expected to provide a means to extend this method to asymmetric structures.

It should be noted that more than one type of constraining or primary tape maybe used in a common structure as long as configurational symmetry and physical compatibility requirements are satisfied.

The primary/constraining tape laminate assemblies disclosed in this invention can be fired in a typical LTCC belt furnace profile to achieve full densification and zero or nearly zero x,y-shrinkage. A typical LTCC belt furnace profile for 951 GREEN TAPE™ (a commercial product from E. I. DuPont) is a three and a half-hour burnout and sintering profile which includes: (1) 25° C. to 60° C. at 2.5° C./min, (2) 60° C. to 400° C. at 19.2° C./min, (3) 400° C. to 435° C. at 1.4° C./min, (4) 435° C. to 850° C. at 7.0° C./min, (5) dwell at 850° C. for 17 min, (6) 850° C. to 40° C. at 17.3° C./min, and (7) 40° C. to room temperature at 0.5° C./min. For anyone skilled in the art, the above profile can be modified according to one's belt furnace specifications so long as adequate organic burnout, ramp rate to peak temperature, peak temperature duration, and descending rate can be optimized to produce the desirable results.

What is claimed is:

1. A method for reducing x,y shrinkage during firing of a green assembly comprising at least one layer of glass-containing non-sacrificial constraining tape and at least one layer of glass-containing primary tape wherein the constraining tape and the primary tape are laminated to form an assembly, and wherein (1) the primary tape is a composition of a ceramic filler and a glass which upon processing transforms the tape to a rigid form, the glass comprising, based on the total composition: $SiO_2$, 52–54, $Al_2O_3$ 12.5–14.5, $B_2O_3$ 8–9, CaO 16–18, MgO 0.5–5, $Na_2O$ 1.7–2.5, $Li_2O$ 0.2–0.3, SrO 0–4, $K_2O$ 1–2 in weight %; and (2) the constraining tape is a composition of a ceramic filler and a glass which upon processing transforms into a rigid form, the glass selected from the group consisting of glass comprising, based on the total composition: $B_2O_3$ 6–13, BaO 20–22, $Li_2O$ 0.5–1.5, $P_2O_5$ 3.5–4.5, $TiO_2$ 25–33, $Cs_2O$ 1–6.5, $Nd_2O_3$ 29–32 in weight %, and a glass comprising, based on the total composition $SiO_2$ 12–14, $ZrO_2$ 3–6, $B_2O_3$ 20–27, BaO 12–15, MgO 33–36, $Li_2O$ 1–3, $P_2O_5$ 3–8, $Cs_2O$ 0–2 in weight % and wherein (3) the glass of the constraining tape initiates sintering before the glass of the primary tape and in sintering, the glass of the primary tape exhibits a change in the measured TMA of about 700° C. or higher and the glass in the constraining tape exhibits a change measured in TMA of at least 75° C. lower than the primary tape.

2. The method of claim 1 wherein the non-sacrificial constraining tape comprises filler particles having a bimodal particle size distribution with D50 of the larger size particles being in the range of 1.5 to 2.0 microns and D50 of the smaller size particles being in the range of 0.3 to 0.8 microns.

3. The method of claim 1 wherein the primary tape comprises filler particles having a bimodal particle size distribution with D50 of the larger size particles being in the range of 1.5 to 2.0 microns and D50 of the smaller size particles being in the range of 0.3 to 0.8 microns.

* * * * *

UNITED STATES PATENT AND TRADEMARK OFFICE
CERTIFICATE OF CORRECTION

PATENT NO. : 6,776,861 B2
DATED : August 17, 2004
INVENTOR(S) : Carl B. Wang, Kenneth W. Hang and Christopher R. Needes It is certified that error appears in the above-identified patent and that said Letters Patent is hereby corrected as shown below:

Column 6,
Table 1, line 1, column 12, $P_2O_5$, please change the number "5.40" to -- 4.5 --.
Table 1, line 15, column 4, PbO, please delete the number "3.00".

Signed and Sealed this

Eighteenth Day of October, 2005

JON W. DUDAS
*Director of the United States Patent and Trademark Office*